(12) United States Patent
Fujishima et al.

(10) Patent No.: US 10,930,810 B2
(45) Date of Patent: Feb. 23, 2021

(54) SOLAR CELL AND METHOD OF MANUFACTURING SOLAR CELL

(71) Applicant: PANASONIC CORPORATION, Osaka (JP)

(72) Inventors: Daisuke Fujishima, Osaka (JP); Hirotaka Katayama, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 37 days.

(21) Appl. No.: 16/257,418

(22) Filed: Jan. 25, 2019

(65) Prior Publication Data

US 2019/0237608 A1 Aug. 1, 2019

(30) Foreign Application Priority Data

Jan. 29, 2018 (JP) .............................. JP2018-012660

(51) Int. Cl.

| H01L 31/103 | (2006.01) |
|---|---|
| H01L 31/047 | (2014.01) |
| H01L 31/112 | (2006.01) |
| H01L 27/144 | (2006.01) |
| H01L 31/18 | (2006.01) |
| H01L 31/0224 | (2006.01) |
| H01L 31/0747 | (2012.01) |

(52) U.S. Cl.
CPC ........ *H01L 31/103* (2013.01); *H01L 27/1443* (2013.01); *H01L 31/022441* (2013.01); *H01L 31/047* (2014.12); *H01L 31/0747* (2013.01); *H01L 31/1124* (2013.01); *H01L 31/1804* (2013.01)

(58) Field of Classification Search
None
See application file for complete search history.

(56) References Cited

U.S. PATENT DOCUMENTS

| 2011/0277817 A1 | 11/2011 | Ide et al. |
| 2016/0343889 A1 | 11/2016 | Mishima |
| 2018/0219119 A1* | 8/2018 | Masuko .............. H01L 31/0224 |

FOREIGN PATENT DOCUMENTS

| WO | 2010/021204 A1 | 2/2010 |
| WO | 2015/118740 A1 | 8/2015 |

* cited by examiner

*Primary Examiner* — Shannon M Gardner
(74) *Attorney, Agent, or Firm* — McDermott Will and Emery LLP

(57) ABSTRACT

A solar cell includes a photoelectric converter having a p-type surface and an n-type surface on a principal surface, a p-side conductor, a p-side Sn layer, an n-side conductor, an n-side Sn layer, a p-side seed layer between the p-type surface and p-side conductor, an n-side seed layer between the n-type surface and n-side conductor, a p-side metal layer covering the p-side seed layer and including metal different from metal of the p-side seed layer, and an n-side metal layer covering the n-side seed layer and including metal different from metal of the n-side seed layer. The diffusion coefficient of copper with respect to the p-side metal layer is less than the diffusion coefficient of copper with respect to a p-side Sn layer. The diffusion coefficient of copper with respect to the n-side metal layer is less than the diffusion coefficient of copper with respect to an n-side Sn layer.

8 Claims, 6 Drawing Sheets

| | |
|---|---|
| DIFFUSION COEFFICIENT OF Cu WITH RESPECT TO Sn | $2.0 \times 10^{-9}$ m²/s to $3.0 \times 10^{-13}$ m²/s |
| DIFFUSION COEFFICIENT OF Cu WITH RESPECT TO Ni | $5.0 \times 10^{-33}$ m²/s to $1.0 \times 10^{-49}$ m²/s |
| DIFFUSION COEFFICIENT OF Cu WITH RESPECT TO Ag | $3.0 \times 10^{-24}$ m²/s to $1.0 \times 10^{-38}$ m²/s |
| DIFFUSION COEFFICIENT OF Cu WITH RESPECT TO Al | $7.0 \times 10^{-20}$ m²/s to $9.5 \times 10^{-29}$ m²/s |

SOLAR CELL AND METHOD OF MANUFACTURING SOLAR CELL

CROSS REFERENCE TO RELATED APPLICATION

This application claims the benefit of priority of Japanese Patent Application Number 2018-012660 filed on Jan. 29, 2018, the entire content of which is hereby incorporated by reference.

BACKGROUND

1. Technical Field

The present disclosure relates to a solar cell and a method of manufacturing the solar cell.

2. Description of the Related Art

Conventionally, a method has been performed, in which the surfaces of a p-side electrode and an n-side electrode are covered with another metal so as to prevent the copper material of the p-side electrode and the n-side electrode from diffusing from the p-side electrode and the n-side electrode to the encapsulant. For example, there is disclosed a solar cell which includes a photoelectric converter having one principal surface that includes a p-type surface and an n-type surface, a p-side electrode disposed on the p-type surface and formed from a plating film, an n-side electrode disposed on the n-type surface and formed from a plating film, a p-side seed layer disposed between the p-type surface and the p-side electrode, and an n-side seed layer disposed between the n-type surface and the n-side electrode (for example, PCT International Publication No.

SUMMARY

Conventionally, depending on the type of the metal for coating the surfaces of the p-side electrode and the n-side electrode, there are cases where the power generating efficiency of a solar cell decreases when metal coating is carried out. For this reason, there is demand for a measure that prevents decrease in power generating efficiency caused by coating the surfaces of the p-side electrode and the n-side electrode.

Therefore, the present disclosure provides a solar cell and a method of manufacturing the solar cell which can prevent decrease in power generating efficiency even when the surfaces of the p-side electrode and the n-side electrode are coated with metal.

A solar cell according to an aspect of the present disclosure includes: a photoelectric converter having a p-type surface and an n-type surface on a principal surface; a p-side conductor on the p-type surface; a p-side conductor surface protective layer on a surface of the p-side conductor; an n-side conductor on the n-type surface; an n-side conductor surface protective layer on a surface of the n-side conductor; a p-side seed layer between the p-type surface and the p-side conductor, the p-side seed layer including metal containing copper; an n-side seed layer between the n-type surface and the n-side conductor, the n-side seed layer including metal containing copper; a p-side metal layer covering the p-side seed layer and including metal different from the metal of the p-side seed layer; and an n-side metal layer covering the n-side seed layer and including metal different from the metal of the n-side seed layer, wherein a diffusion coefficient of copper with respect to the p-side metal layer is less than a diffusion coefficient of copper with respect to the p-side conductor surface protective layer, and a diffusion coefficient of copper with respect to the n-side metal layer is less than a diffusion coefficient of copper with respect to the n-side conductor surface protective layer.

Furthermore, a method of manufacturing a solar cell according to an aspect of the present disclosure includes: forming a p-type surface and an n-type surface on a principal surface of a photoelectric converter; forming a p-side conductor on the p-type surface by plating; forming a p-side conductor surface protective layer on a surface of the p-side conductor; forming an n-side conductor on the n-type surface by plating; forming an n-side conductor surface protective layer on a surface of the n-side conductor; forming a p-side seed layer between the p-type surface and the p-side conductor, the p-side seed layer including metal containing copper; forming an n-side seed layer between the n-type surface and the n-side conductor, the n-side seed layer including metal containing copper; forming a p-side metal layer covering the p-side seed layer and including metal different from metal of p-side seed layer; and forming an n-side metal layer covering the n-side seed layer and including metal different from metal of the n-side seed layer, wherein a diffusion coefficient of copper with respect to the p-side metal layer is less than a diffusion coefficient of copper with respect to the p-side conductor surface protective layer, and a diffusion coefficient of copper with respect to the n-side metal layer is less than a diffusion coefficient of copper with respect to the n-side conductor surface protective layer.

According to the present disclosure, decrease in power generating efficiency can be prevented even when the surfaces of the p-side electrode and the n-side electrode are coated with metal.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, exemplary embodiments of the present disclosure will be described in detail with reference to the drawings. The exemplary embodiments described below each illustrate a particular example of the present disclosure. Accordingly, the numerical values, shapes, materials, elements, the arrangement and connection of the elements, processes, and the order of the processes, etc., indicated in the following exemplary embodiments are mere examples, and are not intended to limit the present disclosure. Therefore, among the elements in the following exemplary embodiments, elements not recited in any of the independent claims defining the most generic concept of the present disclosure are described as optional elements.

It should be noted that the drawings are schematic and do not necessarily provide precise depictions. Throughout the drawings, substantially identical elements share identical reference signs and redundant description may be omitted or simplified.

Furthermore, the expression "approximately XXX" is intended to include that which is considered to be substantially XXX. Taking "substantially orthogonal" as an example, this expression is intended to include, not only that which is perfectly orthogonal, of course, but also that which is considered to be substantially orthogonal.

Hereinafter, a solar cell and a method of manufacturing the solar cell according to the present disclosure will be described.

Embodiment

[Configuration]

Figure 1:
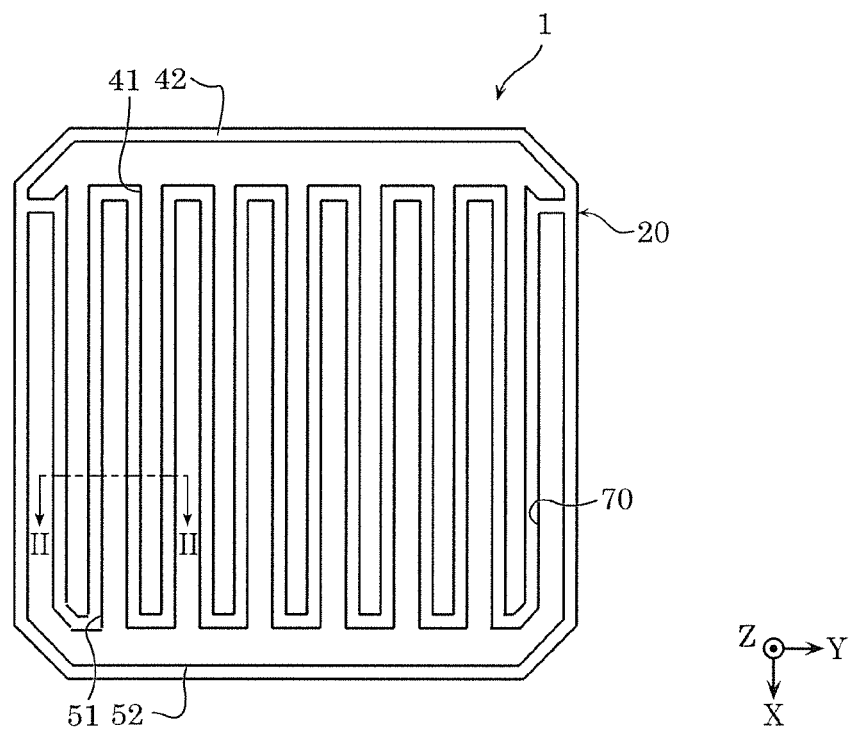
FIG. 1 is a plan view of a solar cell according to an embodiment, viewed from a back surface side.

In a plan view of solar cell 1, respective directions X, Y, and Z are illustrated with a direction normal to solar cell 1 being defined as the Z-axis direction, an arbitrary direction orthogonal to the Z-axis direction being defined as the X-axis direction, a direction orthogonal to the Z-axis direction and the X-axis direction being defined as the Y-axis direction. The respective directions illustrated in FIG. 1 are indicated corresponding to the respective directions illustrated in FIG. 2. The same applies to the figures after FIG. 2 except for figures in which directions X, Y, and Z are not indicated.

FIG. 1 is a plan view illustrating solar cell 1 according to an embodiment.

As illustrated in FIG. 1, solar cell 1 is a light conversion device which can generate power by receiving light such as sunlight, etc. Solar cell 1 includes photoelectric converter 20, n-side electrode 40, and p-side electrode 50.

Photoelectric converter 20 is a component which generates carriers such as electrons and holes by receiving light such as sunlight, etc. Photoelectric converter 20 may generate carriers only when receiving light on the light receiving surface, and may also generate carriers when receiving light not only on the light receiving surface but also on the back surface. Here, the "back surface" means the surface which is on the rear side of the light receiving surface through which light enters from outside of the solar cell, and faces the Z-axis positive direction. The back surface is an example of a principal surface.

Figure 2:
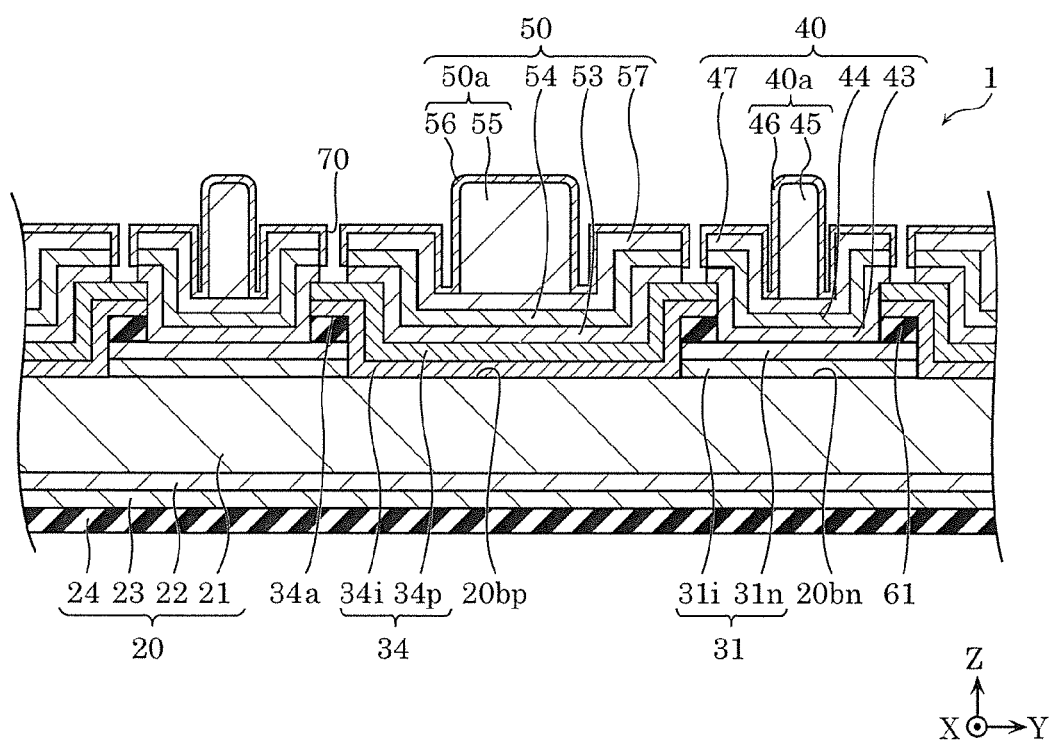
FIG. 2 is a cross-sectional view of the solar cell taken along line II-II in FIG. 1.

FIG. 2 is a cross-sectional view of solar cell 1 taken along line II-II in FIG. 1.

As illustrated in FIG. 1 and FIG. 2, the back surface of photoelectric converter 20 includes p-type surface 20bp and n-type surface 20bn. P-side electrode 50 is disposed above p-type surface 20bp. N-side electrode 40 is disposed above n-type surface 20bn.

Each of p-side electrode 50 and n-side electrode 40 is provided in the shape of a comb such that p-side electrode 50 and n-side electrode 40 interdigitate with each other.

Specifically, p-side electrode 50 includes finger electrode portions 51 and bus bar electrode unit 52 to which finger electrode portions 51 are electrically connected, and n-side electrode 40 includes finger electrode portions 41 and bus bar electrode unit 42 to which finger electrode portions 41 are electrically connected. Wiring components not illustrated in the drawings can be connected to bus bar electrode portions 42 and 52 to enable modularization into a solar cell. It should be noted that there is no particular limitation on the elements of the electrodes such as finger electrode portions 41 and 51 and bus bar electrodes 42 and 52. Accordingly, the electrodes may include only finger electrode portions 41 and 51, for example.

Furthermore, photoelectric converter 20 includes n-type monocrystalline silicon substrate 21 which is a crystalline semiconductor substrate. The crystalline semiconductor substrate may be an n-type polycrystalline silicon substrate, a p-type monocrystalline silicon substrate, or a p-type polycrystalline silicon substrate. In this embodiment, n-type monocrystalline silicon substrate 21 is used as the crystalline semiconductor substrate.

N-type monocrystalline silicon substrate 21 functions as a power generation layer. The thickness of n-type monocrystalline silicon substrate 21 is approximately 100 μm to 300 μm, for example. A texture structure may be formed on the light receiving surface of n-type monocrystalline silicon substrate 21. Here, the "texture structure" is a structure having concave and convex portions that reduce surface reflection and increase the amount of light absorption of photoelectric converter 20. As a specific example of the texture structure is a structure having quadrangular-pyramid shapes or truncated quadrangular-pyramid shapes which are obtained by anisotropic etching on a light receiving surface having (100) plane. The back surface side which is the rear side of the light receiving surface side may include the texture or need not include the texture.

As illustrated in FIG. 2, i-type amorphous silicon layer 22, n-type amorphous silicon layer 23, and protective layer 24 are formed in this order on the light receiving surface side of n-type monocrystalline silicon substrate 21. I-type amorphous silicon layer 22 and n-type amorphous silicon layer 23 function as passivation layers. Protective layer 24 protects the passivation layers, and also has an antireflection function.

I-type amorphous silicon layer 22 is a thin film layer of genuine amorphous silicon, and has a thickness of approximately 0.1 nm to 25 nm, for example. On the other hand, n-type amorphous silicon layer 23 is a thin film layer of amorphous silicon doped with phosphorus or the like, and has a thickness of approximately 2 nm to 50 nm, for example.

Protective layer 24 may include a material having high light transmittance. Such materials include silicon oxide ($SiO_2$), silicon nitride (SiN), silicon oxynitride (SiON), etc. In this embodiment, an SiN layer is formed as protective layer 24. Although the thickness of protective layer 24 can be suitably changed in consideration of the anti-reflective property or the like, the thickness may be approximately 80 nm to 1 μm, for example.

In photoelectric converter 20, each of IN amorphous silicon layer 31 (hereinafter referred to as IN layer 31) which forms an n-type region and IP amorphous silicon layer 34 (hereinafter referred to as IP layer 34) which forms a p-type region is stacked on the back surface side of n-type monocrystalline silicon substrate 21. The surface of IN layer 31 and IP layer 34 are insulated by insulating layer 61. IN layer 31 and IP layer 34 are stacked directly on the back surface of n-type monocrystalline silicon substrate 21. On the other hand, insulating layer 61 is stacked on a portion of IN layer 31.

IN layer 31 includes i-type amorphous silicon layer 31i stacked on the back surface of n-type monocrystalline silicon substrate 21 and n-type amorphous silicon layer 31n stacked on i-type amorphous silicon layer 31i. I-type amorphous silicon layer 31i and n-type amorphous silicon layer 31n can be formed with the same composition and the same thickness as i-type amorphous silicon layer 22 and n-type amorphous silicon layer 23, respectively.

IP layer 34 includes i-type amorphous silicon layer 34i stacked mainly on the back surface of n-type monocrystalline silicon substrate 21, and p-type amorphous silicon layer 34p stacked on i-type amorphous silicon layer 34i. I-type amorphous silicon layer 34i can be formed with the same composition and the same thickness as i-type amorphous silicon layer 22 and i-type amorphous silicon layer 31i, for example. P-type amorphous silicon layer 34p is a thin film layer of amorphous silicon doped with boron (B) or the like. The thickness of p-type amorphous silicon layer 34p may be approximately 2 nm to 50 nm, for example.

From the viewpoint of photoelectric conversion efficiency, IN layer 31 and IP layer 34 are alternately formed in a single direction parallel to the back surface of n-type monocrystalline silicon substrate 21. Furthermore, IN layer 31 and IP layer 34 are formed to cover a wide area of the back surface of n-type monocrystalline silicon substrate 21. For this reason, IN layer 31 and IP layer 34 may be stacked with one layer seamlessly overlapping the other, for example, so that a portion of IN layer 31 and a portion of IP layer 34 overlap with each other. In this case, an insulating layer may be disposed between the one layer and the other layer, in the portion where the one layer overlaps the other layer.

Hereinafter, a configuration in which IP layer 34 is stacked so as to overlap IN layer 31 will be exemplified. In addition, portion of IP layer 34 that overlaps IN layer 31 will be described as "overlapping portion 34a".

Insulating layer 61 is provided at least at a portion between IN layer 31 and IP layer 34 at overlapping portion 34a. Insulating layer 61 has a function of improving insulation between IN layer 31 and IP layer 34. Insulating layer 61 can be formed with the same composition and the same thickness as protective layer 24. Insulating layer 61 is formed from SiN, for example.

Insulating layer 61 is formed over the entire region of IN layer 31 on which IP layer 34 is stacked, or in other words, is formed along overlapping portion 34a. Insulating layer 61 is not stacked on a region of IN layer 31 on which IP layer 34 is not stacked.

N-side electrode 40 is an electrode which collects carriers (electrons) from IN layer 31 of photoelectric conversion unit 20. N-side electrode 40 is formed directly on IN layer 31. P-side electrode 50 is an electrode which collects carriers (holes) from IP layer 34 of photoelectric conversion unit 20. P-side electrode 50 is formed directly on IP layer 34. In this embodiment, the stacking area of IP layer 34 is larger than the stacking area of IN layer 31. Correspondingly, the stacking area of p-side electrode 50 is larger than the stacking area of n-side electrode 40. However, the stacking areas are not limited to this, and the stacking area of p-side electrode 50 may be substantially equal to the stacking area of n-side electrode 40, or the stacking area of p-side electrode 50 may be smaller than the stacking area of n-side electrode 40.

Separating groove 70 which separates n-side electrode 40 and p-side electrode 50 is formed between both electrodes. Separating groove 70 is formed spanning across IN layer 31 to IP layer 34. Separating groove 70 is formed above overlapping portion 34a, for example.

N-side electrode 40 is a stacked structure which includes n-side base layer 43 stacked on IN layer 31, n-side seed layer 44 stacked on n-side base layer 43, n-side metal layer 47 stacked on n-side seed layer 44, n-side conductive layer 45 formed on n-side metal layer 47, and n-side Sn layer 46 formed on n-side conductive layer 45 and n-side metal layer 47. N-side conductor 40a includes n-side conductive layer 45 and n-side Sn layer 46. N-side Sn layer 46 is an example of an n-side conductor surface protective layer. The width of n-side conductive layer 45 in the Y-axis direction is less than the width of n-side electrode 40 in the Y-axis direction.

P-side electrode 50 is a stacked structure which includes p-side base layer 53 stacked on IP layer 34, p-side seed layer 54 stacked on p-side base layer 53, p-side metal layer 57 stacked on p-side seed layer 54, p-side conductive layer 55 formed on p-side metal layer 57, and p-side Sn layer 56 formed on p-side conductive layer 55 and p-side metal layer 57. P-side conductor 50a includes p-side conductive layer 55 and p-side Sn layer 56. P-side Sn layer 56 is an example of a p-side conductor surface protective layer. The width of p-side conductive layer 55 in the Y-axis direction is less than the width of p-side electrode 50 in the Y-axis direction.

N-side base layer 43 and p-side base layer 53 are transparent conductive layers (transparent conductive oxide (TCO) films). N-side seed layer 44 and p-side seed layer 54 may include any one of metals such as copper (Cu), silver (Ag), gold (Au), etc. N-side conductive layer 45 and p-side conductive layer 55 may include any one of metals such as copper, silver, gold, etc. N-side Sn layer 46 and p-side Sn layer 56 include tin.

The transparent conductive layer (TCO film) has a function of improving reflectance of incident light by preventing contact between photoelectric conversion unit 20 and each of n-side seed layer 44 and p-side seed layer 54, and by preventing alloying of n-side seed layer 44 and p-side seed layer 54 with a semiconductor. The transparent conductive layer may include at least one type of metallic oxides having a polycrystalline structure, such as indium oxide ($In_2O_3$), zinc oxide (ZnO), tin oxide ($SnO_2$), or titanium oxide ($TiO_2$), for example. Furthermore, the metallic oxides may be doped with a dopant, such as tin (Sn), zinc (Zn), tungsten (W), antimony (Sb), titanium (Ti), aluminum (Al), cerium (Ce), or gallium (Ga). In this embodiment, the transparent conductive layer includes indium tin oxide (ITO) obtained by doping $In_2O_3$ with Sn. The concentration of the dopant can be set to 0 to 20 weight percent. The thickness of the transparent conductive layer is approximately 30 nm to 150 nm, for example.

A layer including metal includes metal having high conductivity and high light reflectance. Furthermore, such a layer may be formed from metal which can be formed by electroplating. Specifically, a metal, such as copper, tin, titanium, aluminum, nickel (Ni), silver, or gold, or an alloy which includes at least two of such metals can be exemplified as the layer including metal.

In this embodiment, from the viewpoint of conductivity, reflectance, material costs, etc, n-side seed layer 44, p-side seed layer 54, n-side conductive layer 45, and p-side conductive layer 55 are Cu layers. The thickness of the Cu layers of n-side conductive layer 45 and p-side conductive layer 55 may be approximately 10 μm to 50 μm, for example.

N-side seed layer 44 includes metal containing copper, which is formed between n-type surface 20bn and n-side electrode 40. Here, the "seed layer" means a layer to which a current is applied at the time of plating growth. N-side seed layer 44 may be formed on the transparent conductive layer, and n-side conductive layer 45 may be formed by electroplating or physical vapor deposition (PVD) such as sputtering, evaporation, etc, using n-side seed layer 44 as a seed layer.

P-side seed layer 54 includes metal containing copper, and is formed between p-type surface 20bp and p-side electrode 50. P-side seed layer 54 may be formed on the transparent conductive layer, and p-side conductive layer 55 may be formed by electroplating or by PVD, using p-side seed layer 54 as a seed layer.

When seen in the Z-axis negative direction, n-side metal layer 47 covers n-side seed layer 44 between n-side conductor 40a and n-side seed layer 44. N-side metal layer 47 is formed by sputtering or PVD.

Furthermore, n-side metal layer 47 includes metal which is different from the metal of n-side seed layer 44. The diffusion coefficient of copper with respect to n-side metal layer 47 is less than the diffusion coefficient of copper with respect to n-side Sn layer 46 (n-side conductor surface protective layer). This prevents alloying of n-side seed layer 44 which includes metal containing copper and n-side Sn layer 46. When n-side seed layer 44 and n-side Sn layer 46 alloy, the characteristics of n-side seed layer 44 which contains copper changes, and thus the reflectance of incident light decreases. With the configuration described above, decrease in the power generating efficiency of solar cell 1 can be reduced.

When seen in the Z-axis negative direction, p-side metal layer 57 covers p-side seed layer 54 between p-side conductor 50a and p-side seed layer 54. P-side metal layer 57 is formed with sputtering or PVD.

Furthermore, p-side metal layer 57 is formed from metal which is different from the metal of p-side seed layer 54. The diffusion coefficient of copper with respect to p-side metal layer 57 is less than the diffusion coefficient of copper with respect to p-side Sn layer 56. This prevents alloying of p-side seed layer 54 which includes metal containing copper and p-side Sn layer 56. When p-side seed layer 54 and p-side Sn layer 56 alloy, the characteristics of p-side seed layer containing copper changes, and thus the reflectance of incident light decreases. With the configuration described above, decrease in the power generating efficiency of solar cell 1 can be reduced.

N-side metal layer 47 and p-side metal layer 57 may each be a compound including a metallic element which is a magnetic material. Specifically, for the magnetic material, a magnetic material such as iron, nickel, chromium, cobalt, etc., or a magnetic material including two or more of the magnetic materials described above can be given as examples. It should be noted that n-side metal layer 47 and p-side metal layer 57 are not limited to a magnetic material, and n-side metal layer 47 and p-side metal layer 57 need not include a magnetic material. In this case, n-side metal layer 47 and p-side metal layer 57 may be a metal containing titanium. In this embodiment, an alloy of nickel and vanadium is used for n-side metal layer 47 and p-side metal layer 57. The thickness of n-side metal layer 47 and p-side metal layer 57 is less than or equal to 50 nm, for example.

N-side Sn layer 46 is formed on n-side conductive layer 45 and n-side metal layer 47, and p-side Sn layer 56 is formed on p-side conductive layer 55 and p-side metal layer 57, respectively. For example, n-side Sn layer 46 has a function of reducing oxidation of n-side conductive layer 45 which is a Cu layer to thereby reduce decrease in conductivity, and p-side Sn layer 56 has the function of reducing oxidation of p-side conductive layer 55 which is a Cu layer to thereby reduce decrease in conductivity. The thickness of n-side Sn layer 46 and p-side Sn layer 56 may be approximately 1 μm to 5 μm, for example.

[Diffusion Coefficient]

Next, diffusion coefficients will be described.

The diffusion coefficient calculating method is expressed by equation (1) below, using frequency factor $D_0$, diffusion activation energy Q, gas constant R, and absolute temperature T.

$$D = D_0 \times \exp(-Q/RT) \quad \text{(Equation 1)}$$

Figures 3, 4:
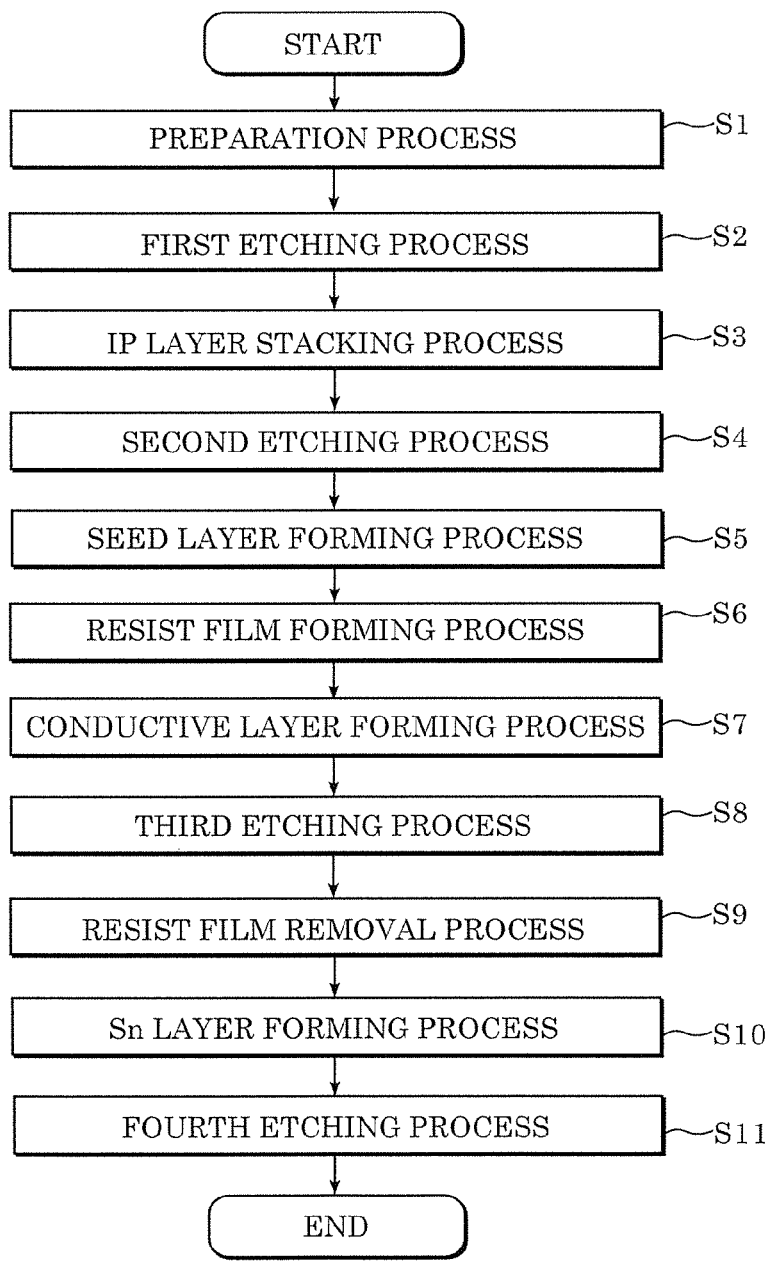
FIG. 3 is a table of diffusion coefficients of copper with respect to an n-side metal layer and a p-side metal layer.
FIG. 4 is a flowchart indicating processes of a method of manufacturing the solar cell according to the embodiment.

Here, metals obtained by including copper (Cu) in tin (Sn), nickel (Ni), silver (Ag), and aluminum (Al), respectively, are used. FIG. 3 shows the diffusion coefficient of copper with respect to n-side metal layer 47 and p-side metal layer 57.

FIG. 3 is a table of diffusion coefficients of copper with respect to n-side metal layer 47 and p-side metal layer 57. FIG. 3 shows diffusion coefficients in the temperature range from 25° C. to 200° C. It can be understood from FIG. 3 that the higher the temperature is, the more readily the copper included in the metal diffuses.

As shown in FIG. 3, the diffusion coefficient of copper with respect to tin is $2.0 \times 10^{-9}$ m$^2$/s to $3.0 \times 10^{-13}$ m$^2$/s, the diffusion coefficient of copper with respect to nickel is $5.0 \times 10^{-33}$ m$^2$/s to $1.0 \times 10^{-49}$ m$^2$/s, the diffusion coefficient of copper with respect to silver is $3.0 \times 10^{-24}$ m$^2$/s to $1.0 \times 10^{-38}$ m$^2$/s, and the diffusion coefficient of copper with respect to aluminum is $7.0 \times 10^{-20}$ m$^2$/s to $9.5 \times 10^{-29}$ m$^2$/s.

From the above, it can be understood that the diffusion coefficient of copper with respect to tin is high. When the temperature condition ranges from 25° C. to 200° C., the diffusion coefficient of copper with respect to n-side metal layer 47 and p-side metal layer 57 is less than or equal to $1.0 \times 10^{-18}$ m$^2$/s, for example.

[Manufacturing Method]

Next, a method of manufacturing solar cell 1 will be described with reference to FIG. 4, FIG. 5A, and FIG. 5B.

FIG. 4 is a flowchart illustrating processes in a method of manufacturing a solar cell according to this embodiment. FIG. 5A is a cross-sectional view illustrating processes in the method of manufacturing the solar cell according to the embodiment. FIG. 5B is a cross-sectional view illustrating processes in the method of manufacturing the solar cell according to the embodiment.

Figure 5A:
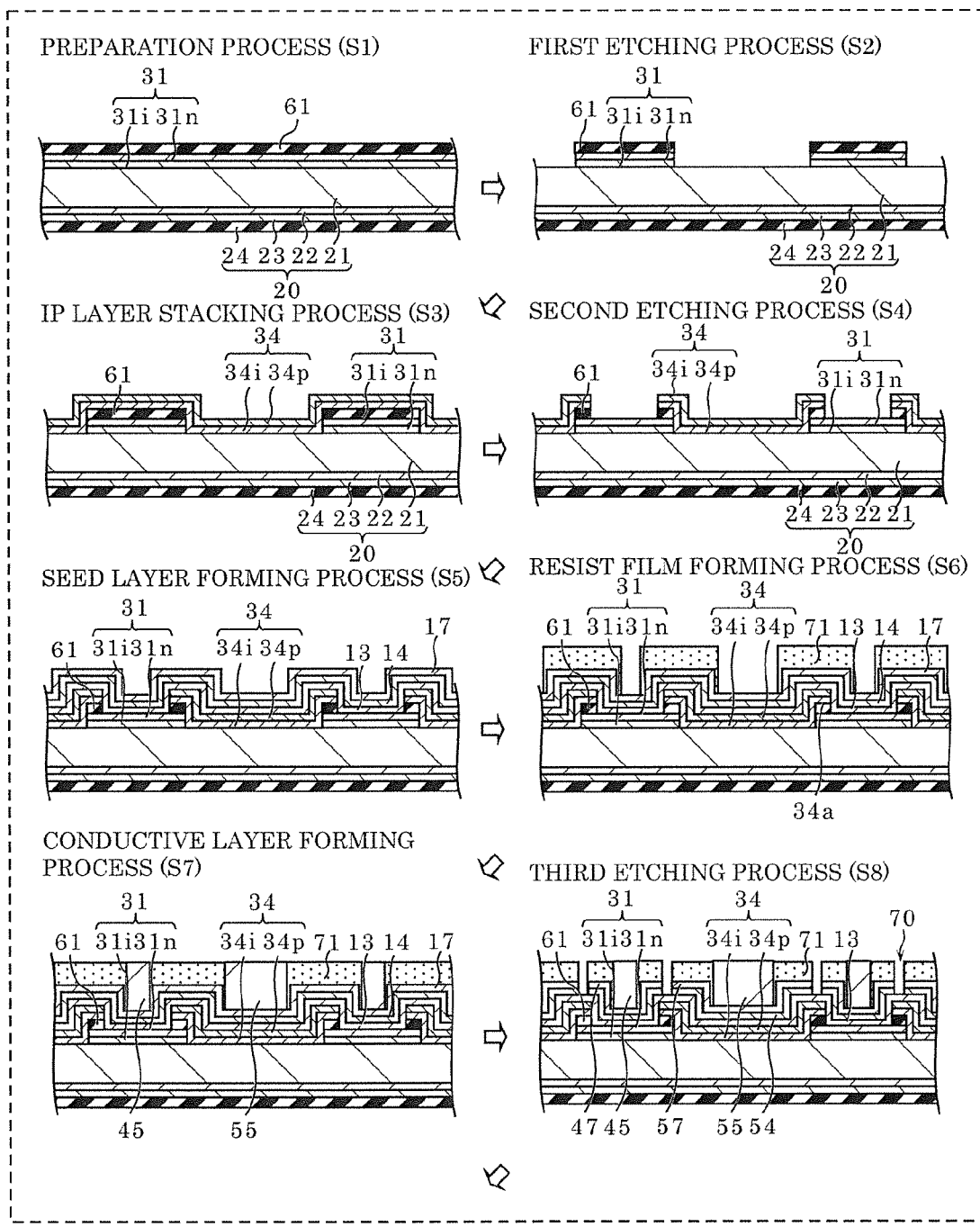
FIG. 5A is a cross-sectional view illustrating processes of the method of manufacturing the solar cell according to the embodiment.

As illustrated in FIG. 4 and FIG. 5A, first, n-type monocrystalline silicon substrate 21 is placed in a vacuum chamber to prepare, by chemical vapor deposition (CVD) and sputtering, a stacked body obtained by sequentially stacking an i-type amorphous silicon layer, an n-type amorphous silicon layer, and insulating layer 61 (protective layer) above n-type monocrystalline silicon substrate 21 (S1: Preparation process). In this embodiment, i-type amorphous silicon layer 22, n-type amorphous silicon layer 23, and protective layer 24 are sequentially stacked on the light receiving surface of n-type monocrystalline silicon substrate 21, and i-type amorphous silicon layer 31i, n-type amorphous silicon layer 31n, and insulating layer 61 are sequentially stacked on back surface 12.

In the process of stacking i-type amorphous silicon layer 22 and i-type amorphous silicon layer 31i by CVD, silane gas (SiH$_4$) diluted with hydrogen (H$_2$) is used as source gas, for example. Furthermore, in the process of stacking n-type amorphous silicon layers 23 and 34i, silane gas (SiH$_4$) to which phosphine (PH$_3$) is added and which is diluted with hydrogen (H$_2$) is used as source gas, for example.

Before i-type amorphous silicon layer 22, etc., are stacked above n-type monocrystalline silicon substrate 21, a texture structure may be formed on the light receiving surface of n-type monocrystalline silicon substrate 21. The texture structure can be formed by anisotropic etching of the (100) plane using a potassium hydroxide (KOH) aqueous solution, for example.

Next, each of the layers stacked on back surface 12 is patterned. First, insulating layer 61 is partially etched and removed (S2: First etching process). In the process of etching insulating layer 61, resist film 71, which is formed by a coating process, such as screen printing or inkjet printing, or photolithography process, for instance, is used as a mask. In the case where insulating layer 61 includes silicon oxide (SiO$_2$), silicon nitride (SiN), or silicon oxynitride (SiON), insulating layer 61 can be etched using a hydrogen fluoride (HF) aqueous solution, for example.

Furthermore, after the etching of insulating layer 61 is completed, resist film 71 is removed, and exposed IN layer 31 is also etched using patterned insulating layer 61 as a mask, for instance (S2: First etching process). In the process of etching IN layer 31, an alkaline etching solution, such as a sodium hydroxide (NaOH) aqueous solution (for example, a 1 weight percent NaOH aqueous solution) is used, for instance. With this process, patterned IN layer 31 and insulating layer 61 are formed above back surface 12.

For the etching of IN layer 31 and insulating layer 61, an etching paste or an etching ink whose viscosity is adjusted may be used. In this case, the etching paste is applied by, for instance, screen printing or inkjet printing, on regions where IN layer 31, etc., have been removed. It should be noted that the same applies to the etching of IP layer 34.

Next, IP layer 34 is stacked on the entirety of back surface 12, except for the edges (S3: IP layer stacking process). Specifically, IP layer 34 is stacked above the patterned IN layer 31 with insulating layer 61 interposed therebetween. As with IN layer 31, IP layer 34 can be formed by forming, i-type amorphous silicon layer 34i and p-type amorphous silicon layer 34p by CVD in the stated order. However, in the process of stacking p-type amorphous silicon layer 34p, diborane (B$_2$H$_6$), for instance, is used as source gas instead of PH$_3$.

Next, IP layer 34 stacked on IN layer 31 is patterned. In this process, first, IP layer 34 stacked on IN layer 31 is partially etched and removed (S4: Second etching process). The region of IP layer 34 which is to be removed is the region above IN layer 31 where n-side electrode 40 will be formed in a later process. The process of etching IP layer 34 is performed using resist film 71 formed by screen printing or the like as a mask, and using an alkaline etching solution, such as an NaOH aqueous solution. In this process, the region of IP layer 34 and the region of IN layer 31 are formed on n-type monocrystalline silicon substrate 21.

It should be noted that since it is usually more difficult to etch IP layer 34 than IN layer 31, an aqueous solution with a higher concentration than the NaOH aqueous solution used for IN layer 31 (for instance, a 10 weight percent NaOH aqueous solution) or nitrohydrofluoric acid (aqueous solution of a mixture of HF and nitric acid (HNO$_3$) (30 weight percent of each, for instance) may be used as an aqueous solution for etching IP layer 34. Alternatively, a NaOH aqueous solution which is heated to approximately 70° C. to 90° C. (hot alkali treatment) may be used.

Furthermore, after the etching of IP layer 34 is completed, resist film 71 is removed, and exposed insulating layer 61 is removed by etching using patterned IP layer 34 as a mask, and using an HF aqueous solution (S4: Second etching process). Then, with the removal of a portion of insulating layer 61, a portion of IN layer 31 is exposed.

Next, base layer 13, conductive layer 14, and metal layer 17 are formed from the bottom in this order on IN layer 31 and IP layer 34 (S5: Seed layer forming process). Specifically, base layer 13, conductive layer 14, and metal layer 17 are stacked from the bottom in this order to cover the entire region on IN layer 31 and IP layer 34. The seed layer forming process corresponds to the process of forming n-side seed layer 44 and the process of forming p-side seed layer 54. Specifically, in the seed layer forming process, the process of forming base layer 13 which becomes n-side base layer 43 and p-side base layer 53, the process of forming conductive layer 14 which becomes n-side seed layer 44 and p-side seed layer 54, and the process of forming metal layer 17 which becomes n-side metal layer 47 and p-side metal layer 57 are performed in this order.

Base layer 13, conductive layer 14, and metal layer 17 are formed by sputtering. It should be noted that base layer 13, conductive layer 14, and metal layer 17 may be formed by another film-forming method such as PVD.

Next, resist film 71 is formed on metal layer 17, in the region corresponding to separating groove 70 (S6: Resist film forming process). Resist film 71 is formed along a region of metal layer 17 which corresponds to overlapping portion 34a.

The thickness of resist film 71 is adjusted in accordance with the total thickness of n-side conductive layer 45 and n-side Sn layer 46 which are formed in a later process, and the total thickness of p-side conductive layer 55 and p-side Sn layer 56 which are formed in a later process. For example, resist film 71 may be formed thicker than the total thickness of n-side conductive layer 45 and n-side Sn layer 46 and the total thickness of p-side conductive layer 55 and p-side Sn layer 56. Specifically, the thickness may be approximately 1 μm to 20 μm. The width of resist film 71 may be made small up to an extent that n-side Sn layer 46 and p-side Sn layer 56 do not come into contact with each other, and may be approximately 10 μm to 200 μm, for example.

Next, n-side conductive layer 45 and p-side conductive layer 55 are formed by electroplating, using, as a seed layer, metal layer 17 on which resist film 71 is formed (S7: Conductive layer forming process). Here, since the plating layer is formed into sections by isolation by resist film 71, the plating layer is separated and n-side conductive layer 45 and p-side conductive layer 55 are obtained. Furthermore, in this process, since metal layer 17 is not patterned, the surface density of the current which flows in the plating process is the same, and thus the thickness of n-side conductive layer 45 and the thickness of p-side conductive layer 55 become substantially the same.

Next, a portion of resist film 71 is etched (S8: Third etching process). Specifically, a portion of resist film 71 is etched using an alkaline solution such as NaOH or KOH. The portion of resist film 71 above overlapping portion 34a of IP layer 34 and IN layer 31, that is, the portion on the upper side of insulating 61, is etched.

By removing a portion of resist film 71, separating groove 70 can be obtained. Here, separating groove 70 is a groove which separates n-side conductive layer 45 and p-side conductive layer 55.

Furthermore, a portion of each of metal layer 17 and conductive layer 14, exposed from separating groove 70 is etched using resist film 71 as a mask (S8: Third etching process). Accordingly, metal layer 17 and conductive layer 14 are divided at the bottom of separating groove 70. With the division of metal layer 17, n-side metal layer 47 and p-side metal layer 57 are formed. Furthermore, with the division of conductive layer 14, n-side seed layer 44 and p-side seed layer 54 are formed. Metal layer 17 and conductive layer 14 can be etched by using, for example, an iron (III) chloride aqueous solution.

Figure 5B:
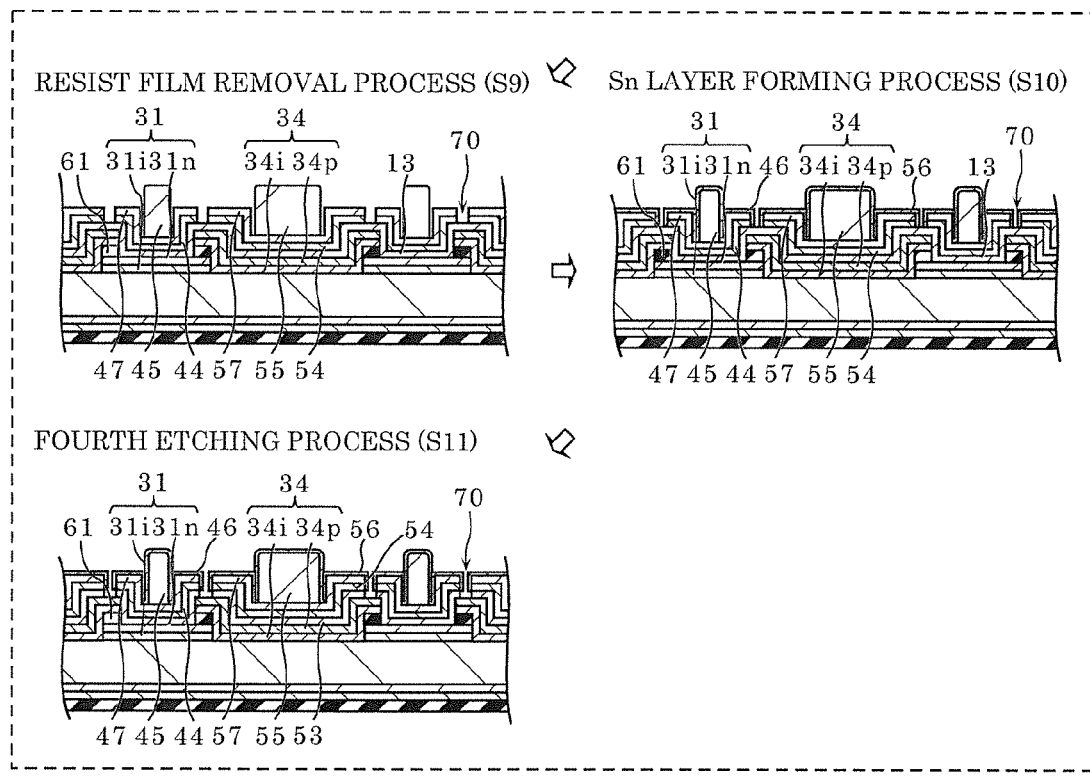
FIG. 5B is a cross-sectional view illustrating processes of the method of manufacturing the solar cell according to the embodiment.

As illustrated in FIG. 4 and FIG. 5B, next, the remaining resist film 71 is removed (S9: Resist film removing process). Specifically, the remaining resist film 71 is etched using an alkaline solution such as NaOH or KOH.

Next, n-side Sn layer 46 is formed on n-side conductive layer 45, and p-side Sn layer 56 is formed on p-side conductive layer 55 by electroplating (S10: Sn layer forming process). N-side Sn layer 46 and p-side Sn layer 56 function as protective layers for reducing oxidation of n-side conductive layer 45 and p-side conductive layer 55, each of which is a metal containing copper, to thereby reduce decrease in conductivity. The Sn layer forming process is an example of a process of forming p-side Sn layer 56 and a process of forming n-side Sn layer 46.

Next, a portion of base layer 13 exposed from separating groove 70 is etched (S11: Fourth etching process). Accordingly, base layer 13 is divided at the bottom of separating groove 70. With the division of base layer 13 n-side base layer 43 and p-side base layer 53 are formed. Base layer 13 can be etched by using a hydrogen chloride (HCl) aqueous solution, etc., for example. In this manner, solar cell 1 can be obtained.

[Effects]

Next, the effects of solar cell 1 and the method of manufacturing solar cell 1 according to this embodiment will be described.

As described above, solar cell 1 according to this embodiment includes: photoelectric converter 20 having p-type surface 20bp and n-type surface 20bn on a principal surface; p-side conductor 50a on p-type surface 20bp; p-side Sn layer 56 on a surface of p-side conductor 50a; n-side conductor 40a on n-type surface 20bn; n-side Sn layer 46 on a surface of n-side conductor 40a; p-side seed layer 54 disposed between p-type surface 20bp and p-side conductor 50a, and including metal containing copper; n-side seed layer 44 disposed between n-type surface 20bn and n-side conductor 40a, and including metal containing copper; p-side metal layer 57 covering p-side seed layer 54 and including metal different from the metal of p-side seed layer 54; and n-side metal layer 47 covering n-side seed layer 44 and including metal different from the metal of n-side seed layer 44. Furthermore, the diffusion coefficient of copper with respect to p-side metal layer 57 is less than the diffusion coefficient of copper with respect to p-side Sn layer 56. In addition, the diffusion coefficient of copper with respect to n-side metal layer 47 is less than the diffusion coefficient of copper with respect to n-side Sn layer 46.

Accordingly, p-side metal layer 57 covers p-side seed layer 54, and n-side metal layer 47 covers n-side seed layer 44. Furthermore, p-side metal layer 57 includes a metal different from p-side seed layer 54. In addition, the diffusion coefficient of copper with respect to p-side metal layer 57 is less than the diffusion coefficient of copper with respect to p-side Sn layer 56. Furthermore, n-side metal layer 47 includes metal which is different from the metal of n-side seed layer 44. In addition, the diffusion coefficient of copper with respect to n-side metal layer 47 is less than the diffusion coefficient of copper with respect to n-side Sn layer 46. In this manner, by disposing p-side metal layer 57 which has a low diffusion coefficient of copper with respect to p-side Sn layer 56, between p-side seed layer 54 and p-side conductor 50a, it is possible to prevent alloying of p-side seed layer 54 and the material included in p-side conductor 50a formed above p-side seed layer 54. Furthermore, by disposing n-side metal layer 47 which has a low diffusion coefficient of copper with respect to n-side Sn layer 46, between n-side seed layer 44 and n-side conductor 40a, it is possible to prevent n-side seed layer 44 and the material included in n-side conductor 40a formed above n-side seed layer 44. Because of this, even when the surface of p-side electrode 50 including p-side conductor 50a, etc., and the surface of n-side electrode 40 including n-side conductor 40a, etc., are coated with metal, the power generating efficiency of solar cell 1 does not easily decrease regardless of the type of the metal.

Therefore, in solar cell 1, decrease in the power generating efficiency can be reduced even when the surfaces of p-side electrode 50 and n-side electrode 40 are coated with metal.

Particularly, in solar cell 1, p-side seed layer 54 and n-side seed layer 44 include a metal containing copper. Since copper has high light reflectance, light that is incident on the light receiving surface can be reliably reflected. Accordingly, with this solar cell 1, the power generating efficiency of solar cell 1 is improved.

Furthermore, even when n-side metal layer 47 and p-side metal layer 57 are formed, resistance loss caused by n-side metal layer 47 and p-side metal layer 57 hardly occurs. In addition, by forming n-side metal layer 47 and p-side metal layer 57 on n-side seed layer 44 and p-side seed layer 54, respectively, diffusion of copper can be prevented.

Furthermore, a method of manufacturing solar cell 1 according to this embodiment includes: forming p-type surface 20bp and n-type surface 20bn on a principal surface of photoelectric converter 20; forming p-side conductor 50a on p-type surface 20bp by plating; forming p-side Sn layer 56 on a surface of p-side conductor 50a; forming n-side conductor 40a on n-type surface 20bn by plating; forming n-side Sn layer 46 on a surface of n-side conductor 40a; forming p-side seed layer 54 between p-type surface 20bp and p-side conductor 50a, which includes metal containing copper; forming n-side seed layer 44 between n-type surface 20bn and n-side conductor 40a, which includes metal containing copper; forming p-side metal layer 57 covering p-side seed layer 54 and including metal different from the metal of p-side seed layer; and forming n-side metal layer 47 covering n-side seed layer 44 and including metal different from the metal of the n-side seed layer. Furthermore, the diffusion coefficient of copper with respect to p-side metal layer 57 is less than the diffusion coefficient of copper with respect to p-side Sn layer 56. In addition, the diffusion coefficient of copper with respect to n-side metal layer 47 is less than the diffusion coefficient of copper with respect to n-side Sn layer 46.

In the method of manufacturing solar cell 1 too, the same effects as the effects described above can be obtained.

Furthermore, in solar cell 1 according to this embodiment, the diffusion coefficient of copper with respect to n-side metal layer 47 and p-side metal layer 57 when the temperature of solar cell 1 ranges from 25° C. to 200° C. is less than or equal to $1.0 \times 10^{-18}$ (m$^2$/s).

With this configuration, diffusion of the material included in p-side seed layer 54 and n-side seed layer 44 can be prevented.

Furthermore, in solar cell 1 according to this embodiment, p-side Sn layer 56 and n-side Sn layer 46 each include a metal layer containing tin.

Furthermore, in solar cell 1 according to this embodiment, p-side metal layer 57 and n-side metal layer 47 each include an alloy of nickel and vanadium.

Furthermore, in solar cell 1 according to this embodiment, both p-side Sn layer 56 and n-side Sn layer 46 include tin.

With this configuration too, the same effects as the effects described above can be obtained.

Furthermore, in solar cell 1 according to this embodiment, p-side conductor 50a may include p-side conductive layer 55 formed above p-side seed layer 54 and p-side Sn layer 56 which covers the surface of p-side conductive layer 55. In addition, n-side conductor 40a may include n-side conductive layer 45 formed above n-side seed layer 44 and n-side Sn layer 46 which covers the surface of n-side conductive layer 45.

With this configuration, by disposing p-side metal layer 57 which has a low diffusion coefficient of copper with respect to p-side Sn layer 56, between p-side seed layer 54 and p-side conductor 50a, it is possible to prevent alloying of p-side seed layer 54 and the material included in p-side conductor 50a formed above p-side seed layer 54. Furthermore, by disposing n-side metal layer 47 which has a low diffusion coefficient of copper with respect to n-side Sn layer 46, between n-side seed layer 44 and n-side conductor 40a, it is possible to prevent alloying of n-side seed layer 44 and the material included in n-side conductor 40a formed above n-side seed layer 44. Because of this, even when the surface of p-side conductor 50a is covered with p-side Sn layer 56, and the surface of n-side conductor 40a is covered with n-side Sn layer 46, the power generating efficiency of solar cell 1 does not easily decrease even when metal coating is carried out.

Variation of Embodiment

Solar cell 1 and a method of manufacturing solar cell 1 according to this variation will be described.

Figure 6:
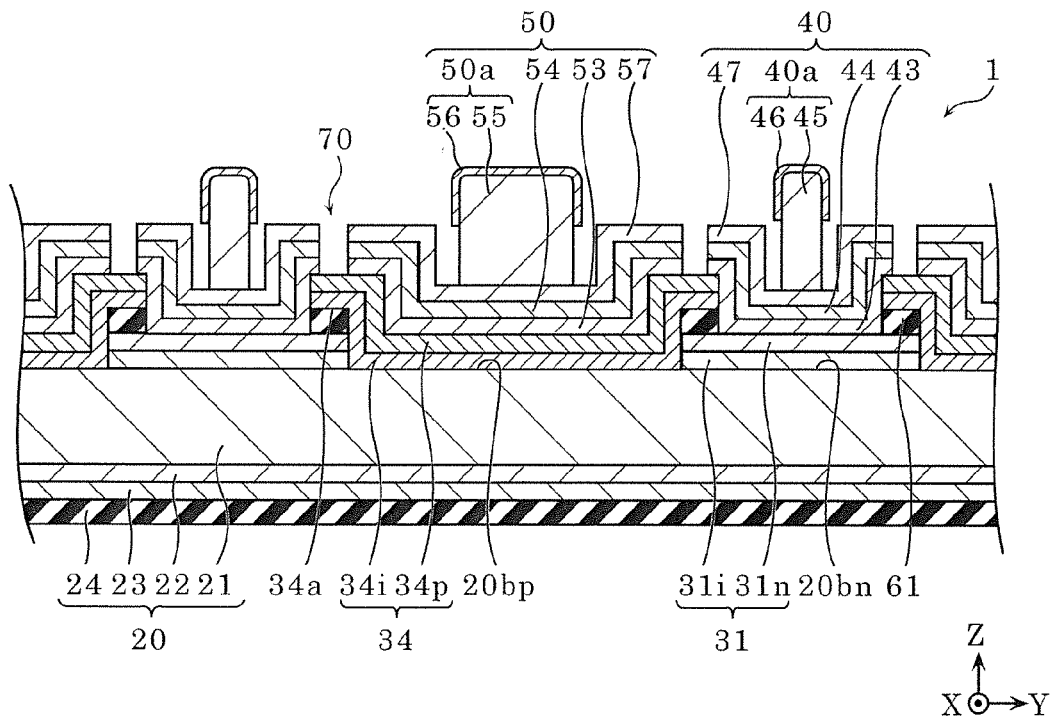
FIG. 6 is a cross-sectional view of a solar cell according to a variation of the embodiment.

FIG. 6 is a cross-sectional view illustrating a cross section of solar cell 1 according to a variation of this embodiment.

Solar cell 1 according to this variation is different from the embodiment in the formation of n-side Sn layer 46 and p-side Sn layer 56 on n-side conductive layer 45 and p-side conductive layer 55, respectively. The configuration of solar cell 1 according to this variation is similar to solar cell 1 according to the embodiment, and identical elements share identical reference signs and detailed description of the elements is omitted.

[Manufacturing Method]

Next, a method of manufacturing solar cell 1 will be described with reference to FIG. 7 and FIG. 8.

Figure 7:
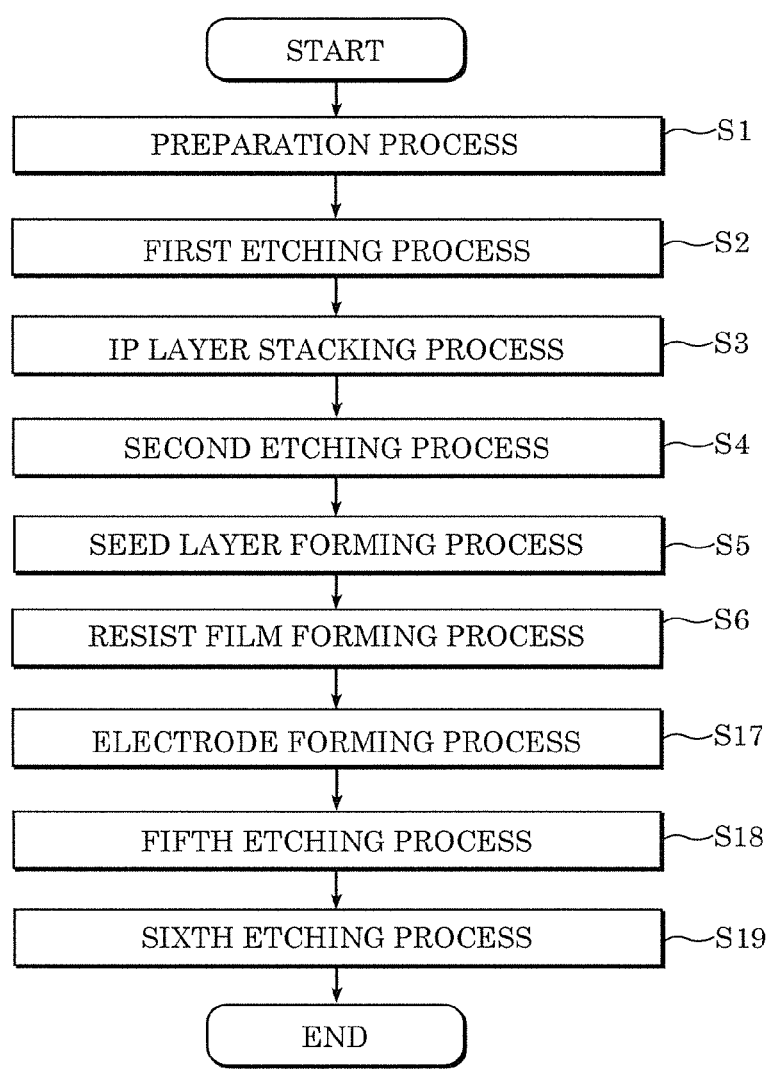
FIG. 7 is a flowchart illustrating processes of a method of manufacturing the solar cell according to the variation of the embodiment.

FIG. 7 is a flowchart illustrating processes of the method of manufacturing solar cell 1 according to the variation of the embodiment. FIG. 8 is a cross-sectional view illustrating processes of the method of manufacturing solar cell 1 according to the variation of the embodiment.

Figure 8:
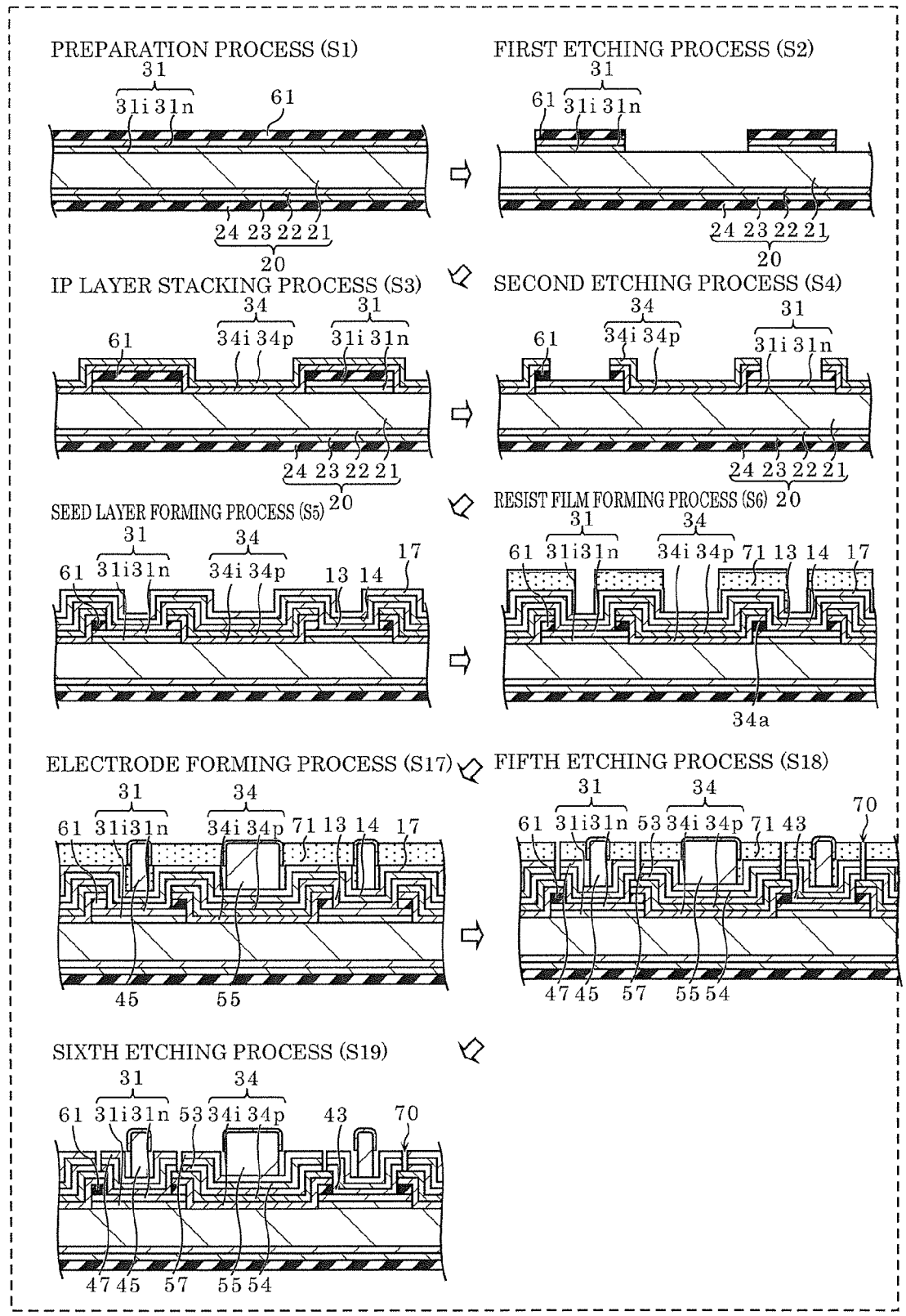
FIG. 8 is a cross-sectional view illustrating processes of the method of manufacturing the solar cell according to the variation of the embodiment.

As illustrated in FIG. 7 and FIG. 8, the preparation process in Step S1, the first etching process in Step S2, the IP layer stacking process in Step S3, the second etching process in Step S4, the seed layer forming process in Step S5, and the resist film forming process in Step S6 are performed.

Next, n-side conductive layer 45 and p-side conductive layer 55, and n-side Sn layer 46 and p-side Sn layer 56 are formed by electroplating, using, as a seed layer, metal layer 17 on which resist film 71 is formed (S17: Electrode forming process). Here, since the plating layer is formed into sections by resist film 71, the plating layer is divided, and thus n-side conductive layer 45 and p-side conductive layer 55, and n-side Sn layer 46 and p-side Sn layer 56, are obtained. Furthermore, in this process, since metal layer 17 is not patterned, the surface density of the current which flows in the plating process is the same, and thus the thickness of n-side conductive layer 45 and n-side Sn layer 46 and the thickness of p-side conductive layer 55 and p-side Sn layer 56 become substantially the same.

N-side Sn layer 46 and p-side Sn layer 56 function as protective layers for reducing oxidation of n-side conductive layer 45 and p-side conductive layer 55, each of which is a metal containing copper, to thereby reduce decrease in conductivity.

Next, a portion of resist film 71 is etched (S18: Fifth etching process). Specifically, a portion of resist film 71 is removed using an alkaline solution such as NaOH or KOH. The portion of resist film 71 above overlapping portion 34a of IP layer 34 and IN layer 31, that is, the portion above insulating 61, is removed.

By removing a portion of resist film 71, separating groove 70 is obtained. Here, separating groove 70 is a groove that separates n-side conductive layer 45 and p-side conductive layer 55, and n-side Sn layer 46 and p-side Sn layer 56.

Furthermore, a portion of each of metal layer 17, conductive layer 14, and base layer 13 exposed from separating groove 70 is etched using resist film 71 as a mask (S18: Third etching process). Accordingly, metal layer 17, conductive layer 14, and base layer 13 divided at the bottom of separating groove 70. With the division of metal layer 17, n-side metal layer 47 and p-side metal layer 57 are formed. Furthermore, with the division of conductive layer 14, n-side seed layer 44 and p-side seed layer 54 are formed. In addition, with the division of base layer 13, n-side base layer 43 and p-side base layer 53 are formed. Metal layer 17, conductive layer 14, and base layer 13 can be etched by using, for example, a mixed aqueous solution of an iron (III) chloride aqueous solution or a sulfuric acid aqueous solution and a hydrogen peroxide solution, or a hydrogen chloride (HCl) aqueous solution, etc.

Next, the remaining resist film 71 is removed (S19: Sixth etching process). Specifically, the remaining resist film 71 is etched using an alkaline solution such as NaOH or KOH. It should be noted that with this process, the surface oxide films of n-side Sn layer 46 and p-side Sn layer 56 can also be removed. Furthermore, the surface oxide films of n-side Sn layer 46 and p-side Sn layer 56 can also be left without removing, when formed from $SnO_2$, etc., having conductivity. In this manner, solar cell 1 can be obtained.

Other Variations, Etc

Although the present disclosure is described above based on the foregoing embodiment and a variation thereof, the present disclosure is not limited to the foregoing embodiment and variation thereof. In the following description, elements that are identical to those in the foregoing embodiment and the variation thereof are assigned the identical reference signs and their description may be omitted.

For example, in the method of manufacturing solar cell 1 according to the foregoing embodiment and the variation thereof, in the forming of IN layer 31 in the preparation process, i-type amorphous silicon layer 31*i* and n-type amorphous silicon layer 31*n* may be formed at the same time or separately, with n-type amorphous silicon layer 31*n* being formed after i-type amorphous silicon 31*i* is formed. Furthermore, in the forming of IP layer 34 in the IP layer stacking process, i-type amorphous silicon layer 34*i* and p-type amorphous silicon layer 34*p* may be formed at the same time or separately, with p-type amorphous silicon layer 34*p* being formed after i-type amorphous silicon 34*i* is formed.

Furthermore, in solar cell 1 and the method of manufacturing solar cell 1 according to the foregoing embodiment, n-side Sn layer 46 may correspond to an n-side metal layer, and p-side Sn layer 56 may correspond to an p-side metal layer.

Forms that can be obtained by various modifications to the foregoing embodiment and the variation thereof that can be conceived by those skilled in the art, and forms obtained by arbitrarily combining elements and functions in the foregoing embodiment and the variation thereof without departing from the essence of the present disclosure are included in the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell, comprising:
   a photoelectric converter having a principal surface that includes a first surface and a second surface;
   a p-side conductor on the first surface, the p-side conductor extending in a predetermined direction;
   an n-side conductor on the second surface, the n-side conductor extending in the predetermined direction;
   a p-side seed layer between the first surface and the p-side conductor, the p-side seed layer including metal containing copper;
   an n-side seed layer between the second surface and the n-side conductor, the n-side seed layer including metal containing copper;
   a p-side metal layer covering the p-side seed layer and including metal different from the metal of the p-side seed layer; and
   an n-side metal layer covering the n-side seed layer and including metal different from the metal of the n-side seed layer, wherein:
   the p-side conductor includes:
     a p-side conductive layer on the p-side seed layer; and
     a p-side conductor surface protective layer covering a top surface and lateral surfaces of the p-side conductive layer, a top surface and lateral surfaces of the p-side metal layer, and lateral surfaces of the p-side seed layer,
   the n-side conductor includes:
     an n-side conductive layer on the n-side seed layer; and
     an n-side conductor surface protective layer covering a top surface and lateral surfaces of the n-side conductive layer, a top surface and lateral surfaces of the n-side metal layer, and lateral surfaces of the n-side seed layer,
   a diffusion coefficient of copper with respect to the p-side metal layer is less than a diffusion coefficient of copper with respect to the p-side conductor surface protective layer, and
   a diffusion coefficient of copper with respect to the n-side metal layer is less than a diffusion coefficient of copper with respect to the n-side conductor surface protective layer.

2. The solar cell according to claim 1, wherein the diffusion coefficient of copper with respect to the p-side metal layer and the n-side metal layer when a temperature of the solar cell ranges from 25° C. to 200° C. is less than or equal to $1.0 \times 10^{-18}$ ($m^2/s$).

3. The solar cell according to claim 1, wherein the p-side conductor surface protective layer and the n-side conductor surface protective layer each include a metal layer containing tin.

4. The solar cell according to claim 1, wherein the p-side metal layer and the n-side metal layer each include an alloy of nickel and vanadium.

5. A method of manufacturing a solar cell, the method comprising:
   forming a first surface and a second surface on a principal surface of a photoelectric converter;
   forming a p-side conductor on the first surface by plating, the p-side conductor extending in a predetermined direction;
   forming an n-side conductor on the second surface by plating, the n-side conductor extending in the predetermined direction;
   forming a p-side seed layer between the first surface and the p-side conductor, the p-side seed layer including metal containing copper;
   forming an n-side seed layer between the second surface and the n-side conductor, the n-side seed layer including metal containing copper;
   forming a p-side metal layer covering the p-side seed layer and including metal different from metal of p-side seed layer; and
   forming an n-side metal layer covering the n-side seed layer and including metal different from metal of the n-side seed layer, wherein:
   the forming of the p-side conductor includes:
     forming a p-side conductive layer on the p-side seed layer; and
     forming a p-side conductor surface protective layer covering a top surface and lateral surfaces of the p-side conductive layer, a top surface and lateral surfaces of the p-side metal layer, and lateral surfaces of the p-side seed layer,
   the forming of the n-side conductor includes:
     forming an n-side conductive layer on the n-side seed layer; and
     forming an n-side conductor surface protective layer covering a top surface and lateral surfaces of the n-side conductive layer, a top surface and lateral surfaces of the n-side metal layer, and lateral surfaces of the n-side seed layer,
   a diffusion coefficient of copper with respect to the p-side metal layer is less than a diffusion coefficient of copper with respect to the p-side conductor surface protective layer, and
   a diffusion coefficient of copper with respect to the n-side metal layer is less than a diffusion coefficient of copper with respect to the n-side conductor surface protective layer.

6. The method of manufacturing a solar cell according to claim 5, wherein
the p-side conductor surface protective layer and the n-side conductor surface protective layer each include a metal layer containing tin.

7. The solar cell according to claim 1, wherein:
a surface oxide film is disposed on a top surface of the p-side conductor surface protective layer, and
a surface oxide film is disposed on a top surface of the n-side conductor surface protective layer.

8. The method of manufacturing a solar cell according to claim 5, further comprising:
forming a surface oxide film on a top surface of the p-side conductor surface protective layer; and
forming a surface oxide film on a top surface of the n-side conductor surface protective layer.

\* \* \* \* \*